(12) United States Patent
Morita et al.

(10) Patent No.: US 9,516,721 B2
(45) Date of Patent: Dec. 6, 2016

(54) ORGANIC ELECTRO-LUMINESCENCE LIGHT-EMITTING DEVICE AND PRODUCTION METHOD OF THE SAME

(75) Inventors: Shigenori Morita, Ibaraki (JP); Ryohei Kakiuchi, Ibaraki (JP); Takahiro Nakai, Ibaraki (JP); Jin Yoshikawa, Ibaraki (JP); Masahiko Watanabe, Ibaraki (JP); Junichi Nagase, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 106 days.

(21) Appl. No.: 13/878,513

(22) PCT Filed: Oct. 6, 2011

(86) PCT No.: PCT/JP2011/073090
§ 371 (c)(1),
(2), (4) Date: Apr. 9, 2013

(87) PCT Pub. No.: WO2012/050043
PCT Pub. Date: Apr. 19, 2012

(65) Prior Publication Data
US 2013/0193844 A1    Aug. 1, 2013

(30) Foreign Application Priority Data

Oct. 15, 2010  (JP) ................................ 2010-232976
Oct. 5, 2011   (JP) ................................ 2011-221022

(51) Int. Cl.
*H05B 33/26* (2006.01)
*H05B 33/14* (2006.01)
(Continued)

(52) U.S. Cl.
CPC ........... *H05B 33/145* (2013.01); *H01L 25/048* (2013.01); *H01L 51/5203* (2013.01);
(Continued)

(58) Field of Classification Search
CPC .................................................. H01L 2251/566
USPC .......................................................... 313/504
See application file for complete search history.

(56) References Cited

U.S. PATENT DOCUMENTS 6,228,228 B1    5/2001  Singh et al.
6,259,838 B1    7/2001  Singh et al.
(Continued)

FOREIGN PATENT DOCUMENTS

CN    1638549 A    7/2005
CN    1905769 A    1/2007
(Continued)

OTHER PUBLICATIONS

Translation of the International Preliminary Report on Patentability (PCT/IB/338) (1 page), (PCT/IB/373) (1 page) of International Application No. PCT/JP2011/073090 mailed May 16, 2013 (Forms PCT/ISA/237) (5 pages).

(Continued)

*Primary Examiner* — Nimeshkumar Patel
*Assistant Examiner* — Christopher Raabe
(74) *Attorney, Agent, or Firm* — Westerman, Hattori, Daniels & Adrian, LLP

(57) ABSTRACT

In order to provide an organic electroluminescent light-emitting device with less uneven brightness, which can be manufactured at low cost, a plurality of ribbon-like organic electroluminescent elements are connected to wires, which are connected to electrode terminals for energization at specific locations in a terminal region and mounted on a base material which has a substantially plate-like shape.

19 Claims, 12 Drawing Sheets

(51) Int. Cl.
*H01L 25/04* (2014.01)
*H01L 51/52* (2006.01)
*H01L 51/56* (2006.01)
*H01L 51/00* (2006.01)

(52) U.S. Cl.
CPC ........... *H01L51/56* (2013.01); *H01L 51/0097* (2013.01); *H01L 51/5253* (2013.01); *H01L 2251/5338* (2013.01); *H01L 2251/566* (2013.01); *H01L 2924/0002* (2013.01)

(56) References Cited

U.S. PATENT DOCUMENTS

| | | |
|---|---|---|
| 6,259,846 B1 | 7/2001 | Roach et al. |
| 6,274,978 B1 | 8/2001 | Roach et al. |
| 2005/0140285 A1 | 6/2005 | Park et al. |
| 2005/0140291 A1* | 6/2005 | Hirakata et al. ............ 313/512 |
| 2007/0170838 A1 | 7/2007 | Harada et al. |
| 2009/0267507 A1 | 10/2009 | Takashima et al. |

FOREIGN PATENT DOCUMENTS

| | | |
|---|---|---|
| CN | 101217837 A | 7/2008 |
| JP | 07-006875 A | 1/1995 |
| JP | 2000-298443 A | 10/2000 |
| JP | 2002-538502 A | 11/2002 |
| JP | 2003-051380 A | 2/2003 |
| JP | 2005-122646 A1 | 12/2005 |
| JP | 2007-026971 A | 2/2007 |
| JP | 2009-256709 A | 11/2009 |
| JP | 2010-80271 A | 4/2010 |
| WO | 2007/034647 A | 3/2007 |

OTHER PUBLICATIONS

International Search Report for PCT/JP2011/073090, mailing date of Nov. 22, 2011.
Chinese Office Action dated Jan. 28, 2015, issued in corresponding Application No. 201180049580.8, with English translation (25 pages).
Chinese Office Action dated Sep. 21, 2015, issued in corresponding application No. 201180049580.8, with English Translation (18 pages).
Chinese Office Action dated Mar. 1, 2016, issued in corresponding application No. 201180049580.8, with English Translation (20 pages).
Office Action dated Jun. 16, 2015, issued with counterpart Japanese patent application No. 2011-221022, with English translation (7 pages).

* cited by examiner

ORGANIC ELECTRO-LUMINESCENCE
LIGHT-EMITTING DEVICE AND
PRODUCTION METHOD OF THE SAME

TECHNICAL FIELD

The present invention relates to an organic electroluminescent light-emitting device with less uneven brightness, which can be manufactured at low cost, and a method of manufacturing the same.

BACKGROUND ART

An organic electroluminescent (hereinafter referred to as "organic EL") light-emitting device, which is expected as a next-generation light-emitting device having low power consumption, can emit extensive colors of light originating from an organic light-emitting material and is formed of a self-light-emitting element, and thus, also receives attention as a display of a TV set or the like.

An organic EL element used in such an organic EL light-emitting device has a feature of being a thinner element compared with an inorganic EL element and being a surface light emitting element, and thus, applications for an illuminating apparatus, a backlight unit of a liquid crystal display, a light-emitting component for display decoration, digital signage, and the like which use these features are also expected. In particular, the thickness of an organic EL layer is several hundred nm, which is very thin, and thus, by forming a transparent support substrate and having a configuration in which light which passes through the transparent substrate can be taken out also from an opposite surface of the substrate, a transparent see-through type light-emitting element can be formed. Therefore, novel decoration and digital signage using an organic EL light-emitting device having a transparent see-through type light-emitting element mounted thereon are expected to be developed. Various kinds of advertisements including such display decoration, digital signage, and shop dressing are often relatively large, and thus, an organic EL light-emitting device used therein is desired to be larger accordingly. However, in reality, it is difficult to manufacture a large organic EL light-emitting device from the technological viewpoint and from the viewpoint of manufacturing cost. Therefore, together with development of a large organic EL light-emitting device, development of a method of manufacturing a large organic EL light-emitting device at low cost is required.

Methods of increasing the size of an organic EL light-emitting device conventionally include a method of increasing the size of the device by increasing the size of the substrate (mother glass) itself of the organic EL element. Methods of reducing costs include a method of increasing the number of the devices manufactured in one batch. However, an organic EL layer of an organic EL element is generally formed using vacuum deposition, and, as the size of the substrate increases, the manufacturing facilities using vacuum deposition becomes more expensive. Further, vacuum deposition has problems that it is technically difficult to uniformly form on a larger substrate an organic EL layer having a very small thickness of several hundred nm as the total thickness (inter-electrode distance), and in addition, as the substrate becomes larger, the use efficiency (yields) of a material becomes lower. Further, as described above, in an organic EL element used in an organic EL light-emitting device, the total thickness (inter-electrode distance) of an organic EL layer is several hundred nm, which is very small, and thus, extremely minute dust or the like is liable to cause a defect such as a short circuit. Therefore, there are problems that increase in number of the devices manufactured in one batch has a limit and the risk becomes higher as the size of the substrate increases.

It has been proposed to realize increasing the size of an organic EL light-emitting device not by increasing the size of a substrate itself of an organic EL element but by elongating a substrate of an organic EL element so as to have a fiber-like shape and arranging side by side a plurality of the fiber-like organic EL elements on a large base material, and to realize reduction in costs not by increasing the number of the devices manufactured in one batch but by using a roll-to-roll manufacturing process (see, for example, JP-A-2002-538502 and JP-A1-2005-122646).

SUMMARY OF THE INVENTION

However, in the display device described in JP-A-2002-538502, in terms of the features of the device for display use, terminals are provided on the plurality of segmentalized organic EL layers, respectively, and electrical connection is made by pressing a contact against the terminals, and thus, there is a problem that the very thin organic EL layers are damaged and uneven brightness or the like is liable to be caused. On the other hand, in the linear light-emitting device described in JP-A1-2005-122646, no terminal is provided on an organic EL layer, and thus, an organic EL layer is not damaged. However, the substrate itself has the shape of a fiber (linear object), and thus, it is impossible to provide a terminal region for connection to a power source on a side portion along a longitudinal direction of the substrate. Therefore, a terminal region is provided at an end in the longitudinal direction. Therefore, in order to manufacture the linear light-emitting device by a roll-to-roll process, it is necessary to continuously feed an elongated substrate material and to provide a terminal region in front of and at the back of (in the longitudinal direction) a substrate portion (fiber-like substrate portion) corresponding to one light-emitting element. In order to attain this, it is necessary to adopt a method of intermittently moving the roll to form the above-mentioned pattern or the like. However, in a method of intermittently moving the roll, a pattern cannot be continuously formed (continuous process cannot be performed), and thus, there is a problem that the manufacturing efficiency is low and the manufacturing cost is high.

An organic EL light-emitting device is provided with less uneven brightness, which can be manufactured at low cost, and a method of manufacturing the organic EL light-emitting device.

According to a first gist, there is provided an organic EL light-emitting device, including a plurality of organic EL elements arranged over a base material, each of the plurality of organic EL elements including a substrate, an organic EL layer, and a first electrode and a second electrode which vertically sandwich the organic EL layer, in which: an entirety of the each of the plurality of organic EL elements is ribbon-shaped; the organic EL layer sandwiched between the first electrode and the second electrode is formed along a longitudinal direction of the ribbon-shaped substrate; and the organic EL layer has a terminal region for connection to a power source, the terminal region being provided at least at one side edge of both side edges thereof along the longitudinal direction of the organic EL layer.

Further, according to a second gist, there is provided a method of manufacturing an organic EL light-emitting device, including: arranging a plurality of organic EL elements each formed by the following steps (A) to (F) over a base material; and making electrical connection at arbitrary locations of terminal regions thereof:

(A) forming a first electrode over a long sheet-like substrate;

(B) cutting along a longitudinal direction the long sheet-like substrate having the first electrode formed thereover to form a long and ribbon-shaped laminated body;

(C) forming, over the long and ribbon-shaped laminated body, an organic EL layer along the longitudinal direction thereof;

(D) forming a second electrode over the organic EL layer;

(E) under a state in which, among both side edges of the long and ribbon-shaped laminated body along the longitudinal direction, a side edge on which an electrode for connection to a power source is located is left, encapsulating an upper surface of the long and ribbon-shaped laminated body by using an encapsulating material to form a terminal region as the side edge which is not encapsulated and on which the electrode is located; and (F) cutting the long and ribbon-shaped laminated body to form a ribbon-shaped laminated body having a predetermined length.

Specifically, by increasing the size of an organic EL light-emitting device not by increasing the size of a substrate itself of an organic EL element but by manufacturing a small high-performance organic EL element at high throughput and at low cost and combining a plurality of such small organic EL elements, a low-cost and high-performance large organic EL light-emitting device might be manufactured. By forming a ribbon-like organic EL element, forming an organic EL layer along a longitudinal direction of a substrate, and providing along the organic EL layer a terminal region for connection to a power source at least at one side edge of both side edges of the organic EL layer along the longitudinal direction, an organic EL element without uneven brightness could be continuously manufactured with efficiency without damaging the organic EL layer by connecting a terminal unlike the description in JP-A-2002-538502 and without the inconvenience of intermittently moving a roll in manufacture unlike the description in JP-A1-2005-122646.

In this way, the organic EL light-emitting device is an organic EL light-emitting device formed by arranging a plurality of organic EL elements. The organic EL elements have a ribbon-like shape. The organic EL layer sandwiched between the first electrode and the second electrode is formed along the longitudinal direction of the substrate. The terminal region for connection to the power source is provided along the organic EL layer at least at one side edge of both the side edges of the organic EL layer along the longitudinal direction. Therefore, the organic EL element can be continuously manufactured without intermittently driving a roll to reduce productivity. Further, the organic EL light-emitting device uses the organic EL element in which the terminal region for connection to the power source is continuously provided along the organic EL layer at least at one side edge of both the side edges of the organic EL layer along the longitudinal direction, and thus, differently from a conventional case in which connection to the power source is made at a predetermined specific location, connection to the power source can be made at an arbitrary location in the terminal region, and, so to speak, the flexibility of choice of the location of the connection is increased. Therefore, when the plurality of ribbon-like organic EL elements are arranged side by side to manufacture the organic EL light-emitting device, it is possible to connect one wire for connection to the power source so as to be placed across terminal regions of two adjacent ribbon-like organic EL elements to enable the common use (number reduction) of the wire. Further, even when the terminal regions of the ribbon-like organic EL elements are arranged so as to overlap each other or so as to be overlaid on each other, connection to the power source can be made with ease, and thus, downsizing of the organic EL light-emitting device as a whole is also possible. Further, as described above, in the organic EL light-emitting device, the terminal region is not provided on the organic EL layer and connection to the power source is not made by pressing a contact against the organic EL layer, and thus, the organic EL layer is not damaged and uneven brightness is not caused.

When the terminal region can be connected to the power source via an auxiliary electrode, voltage can be applied more uniformly to the entire organic EL layer, and thus, uneven brightness is less liable to be caused.

Further, according to a method of manufacturing an organic EL light-emitting device in which a plurality of organic EL elements formed by the following steps (A) to (F) are arranged over a base material and electrical connection is made at an arbitrary location of their terminal regions, the organic EL light-emitting elements can be manufactured by a roll-to-roll process with more efficiency to further reduce the manufacturing cost of the organic EL light-emitting device. Further, in the organic EL element, it is not necessarily required to form an insulating layer between the first electrode and the organic EL layer, and thus, the cost and time necessary for the formation thereof can be reduced.

(A) a step of forming a first electrode over a long sheet-like substrate (B) a step of cutting along a longitudinal direction the long sheet-like substrate having the first electrode formed thereover to form a long and ribbon-shaped laminated body (C) a step of forming, over the long and ribbon-shaped laminated body, an organic EL layer along the longitudinal direction thereof (D) a step of forming a second electrode over the organic EL layer (E) a step of, under a state in which, among both side edges of the long and ribbon-shaped laminated body along the longitudinal direction, a side edge on which an electrode for connection to a power source is located is left, encapsulating an upper surface of the laminated body by using an encapsulating material to form a terminal region as the side edge which is not encapsulated and on which the electrode is located (F) a step of cutting the long and ribbon-shaped laminated body to form a ribbon-shaped laminated body having a predetermined length Further, in a method of manufacturing an organic EL light-emitting device in which, the above-mentioned steps (B) and (C) are replaced by the following steps (B-1) to (C-1), contact between both electrodes, the first electrode and the second electrode, in the organic EL light-emitting element can be prevented without fail to inhibit occurrence of a short circuit (short).

(B-1) a step of forming, using a photomask, over the first electrode, an insulating layer in which openings for exposing predetermined portions are arranged in a width direction in a plurality of lines (B-2) a step of cutting the long sheet-like substrate having the insulating layer formed thereon along the longitudinal direction into pieces each having a line of the openings to form a long and ribbon-shaped laminated body (C-1) a step of forming, over the long and ribbon-shaped laminated body, an organic EL layer at least in a state of filling the openings Above all, in a method of manufacturing an organic EL light-emitting device further including the following step (G), in the organic EL light-emitting element, voltage can be applied more uniformly to the entire organic EL layer, and thus, an organic EL light-emitting device with less uneven brightness can be obtained.

(G) a step of forming an auxiliary electrode at the side edge on which the electrode for connection to the power source is located of both the side edges of the long and ribbon-shaped laminated body along the longitudinal direction Further, in a method of manufacturing an organic EL light-emitting device in which: at least the above-mentioned steps (C) to (E) are carried out under a vacuum or under an inactive gas atmosphere; and the steps are respectively carried out without being exposed to air and the nonexposure to the air is kept also between the steps, the efficiency can be increased in the Further, in a method of manufacturing an organic EL light-emitting device in which: at least the above-mentioned steps (C) to (E) are carried out under a vacuum or under an inactive gas atmosphere; and the steps are respectively carried out without being exposed to air and the nonexposure to the air is kept also between the steps, the efficiency can be increased in the respective steps and respective vapor deposited films can be formed so as to have more uniform thickness, and thus, a higher-quality organic EL light-emitting device can be obtained.

Further, in a method of manufacturing an organic EL light-emitting device in which: at least the above-mentioned steps (C-1), (D), and (E) are carried out under a vacuum or under an inactive gas atmosphere; and the steps are respectively carried out without being exposed to air and the nonexposure to the air is kept also between the steps, the efficiency can be increased in the respective steps and respective vapor deposited films can be formed so as to have more uniform thicknesses, and thus, a higher-quality organic EL light-emitting device can be obtained.

In the present invention, "ribbon-like" means strip-like or tarpaulin-like as a whole, and, usually, the shorter side of the shape is 10 to 50 mm and the longer side is 50 to 500 mm.

Further, in the present invention, the terminal region means a region which can be used as a terminal, and specifically means a region which can be connected to a wire or the like connected to the power source.

DESCRIPTION OF EMBODIMENTS

Next, an embodiment for carrying out the present invention is described.

Figure 1:
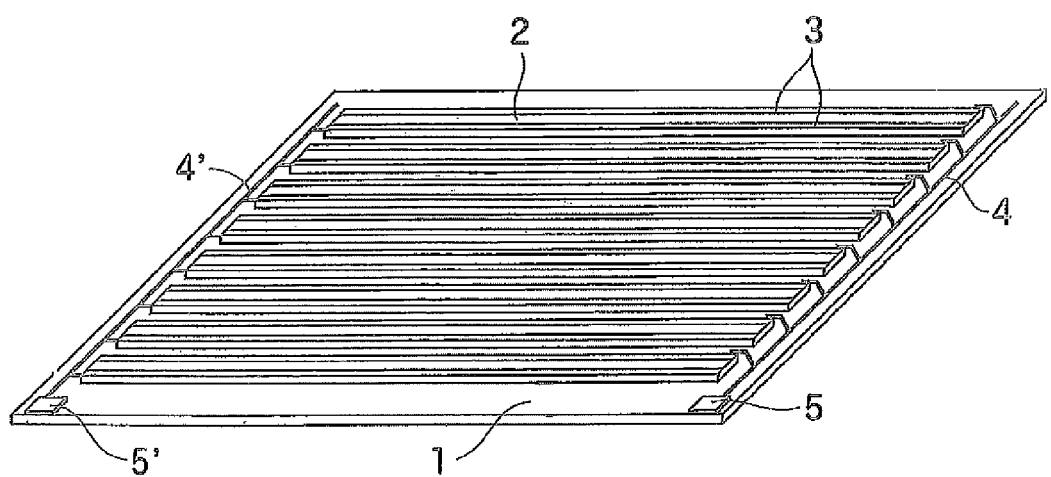
FIG. 1 is an explanatory diagram of an embodiment of the present invention.

FIG. 1 is an explanatory diagram for realizing an organic EL light-emitting device of the present invention. A plurality of ribbon-like organic EL elements 2 are arranged side by side (in a state of unified orientation of the length direction) on a base material 1 formed of substantially plate-like glass. Both edges of each organic EL element 2 along its longitudinal direction are formed as continuous terminal regions 3 along the longitudinal direction. A right end of one of the terminal regions 3 is connected via a wire 4 to an electrode terminal 5 for energization, while a left end of the other of the terminal regions 3 is connected via a wire 4' to an electrode terminal 5' for energization. Note that, the organic EL light-emitting device is a bottom emission type light-emitting device in which the organic EL elements 2 emit light toward a rear surface side of the figure (downward to below the plane of the figure, that is, to the base material 1 side). Further, in the figure, the respective portions are schematically illustrated and not drawn to scale (the same can be said with regard to the remaining figures to be mentioned below).

Figure 2:
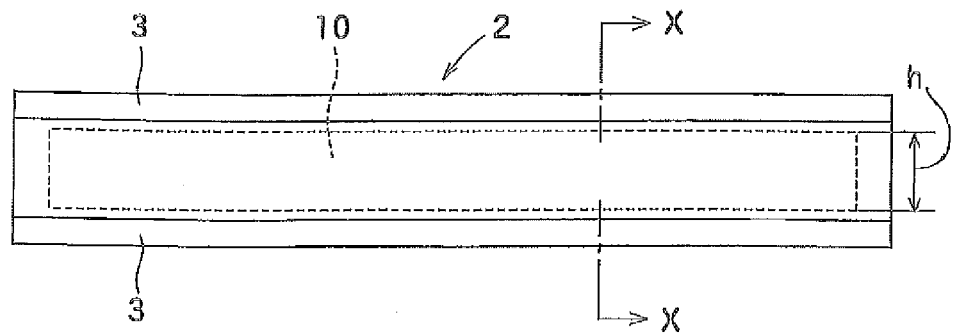
FIG. 2 is a plan view of an organic EL element 2 used in the embodiment.

In the device described above, as illustrated in a plan view of FIG. 2, an organic EL element 2 is formed so as to have the shape of a ribbon having a width of 20 mm and a length of 300 mm, and an organic EL layer 10 having a width h of 13 mm is formed along the longitudinal direction thereof. The terminal regions 3 which can be connected to the wires 4 are provided at both right and left side edges of the organic EL layer 10 along the longitudinal direction.

Figure 3:
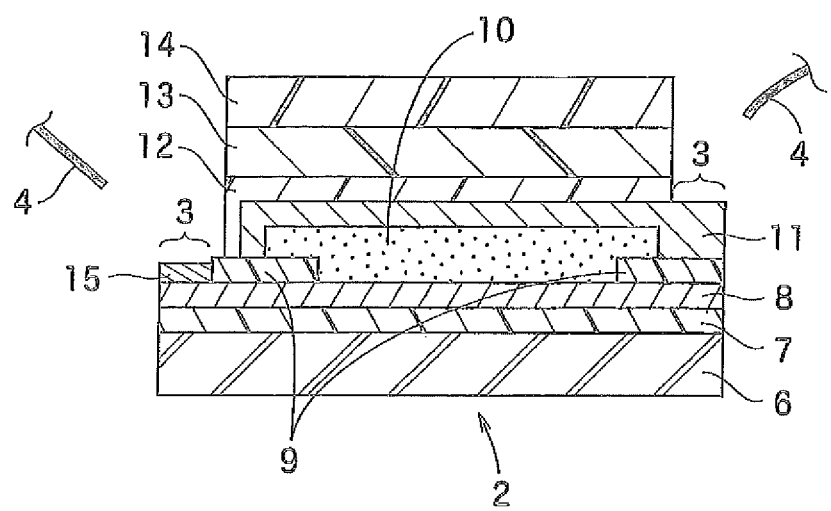
FIG. 3 is a sectional view of the organic EL element 2 used in the embodiment.

The organic EL element 2 is described in further detail in the following. As illustrated in FIG. 3, which is a sectional view taken along the line X-X of FIG. 2, first, a planarizing layer 7, a first electrode 8, the organic EL layer 10, and a second electrode 11 are laminated in this order on a substrate 6 which is flexible thin glass. Further, so that the first electrode 8 and the second electrode 11 do not come into contact with each other, an insulating layer 9 is provided therebetween. Further, under a state in which portions to be the terminal regions 3 to be connected to the wires 4 afterwards remain, a pre-barrier layer 12, an encapsulating resin 13, and a barrier-type sheet 14 are laminated in this order.

The organic EL element 2 described above can be obtained by, for example, the following roll-to-roll process. That is, as the substrate 6, a long sheet-like flexible thin glass having a width i of 300 mm, a length j of 140 m, and a thickness of 100 μm is prepared (see FIG. 4A). By applying an organic EL insulating material (JEM-477 manufactured by JSR Corporation) onto the thin glass and drying, and carrying out postbaking at 220° C. for 1 hour, the planarizing layer 7 having a thickness of 1 μm is formed. Then, using a long sputtering apparatus, the first electrode 8 is formed on the planarizing layer 7. Note that, the first electrode 8 maybe formed by patterning. As such patterning, for example, there can be used a method in which an etching resist is patterned via a photomask and then the first electrode 8 is etched.

Figure 4A:
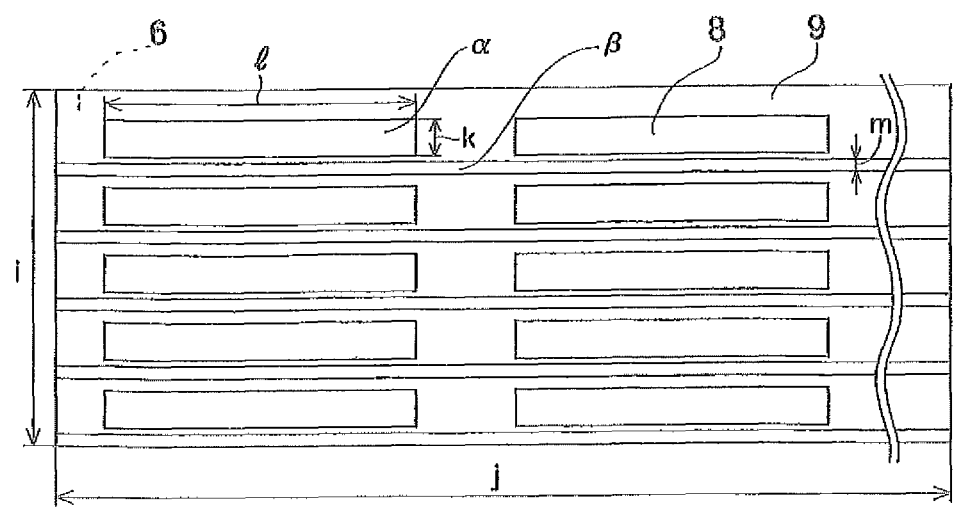
FIGS. 4A and 4B are both explanatory diagrams of a step of obtaining the organic EL element 2.
Figure 4B:
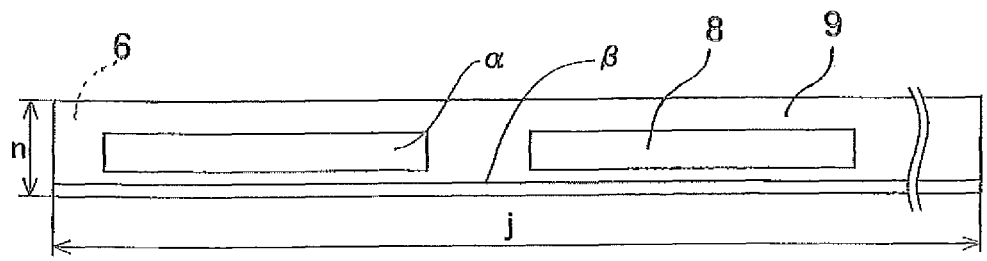

Then, as illustrated in FIG. 4A, on the first electrode 8, the insulating layer 9 is formed in which a plurality of openings for exposing organic EL layer forming portions (α) that are portions to be held in contact with the organic EL layer 10 in a post step and an auxiliary electrode forming portion (β) that is a portion in which an auxiliary electrode 15 is to be formed are arranged in lines. Specifically, the insulating layer 9 is formed by patterning through repeatedly carrying out a step of applying a photosensitive insulating material, carrying out exposure via a photomask, and carrying out development. In this embodiment, the organic EL layer forming portion (α) has a width k of 11 mm and a length l of 280 mm, and the auxiliary electrode forming portion (β) has a width m of 2.5 mm and a length of 140 m (entire length of the thin glass). After the insulating layer 9 is formed, the long sheet-like laminated body is cut by a laser or the like along its longitudinal direction into pieces each having both a line of the openings (portions α) and a line of the opening (portion β) to obtain a long ribbon-like laminated body (having a width n of 20 mm and the length j of 140 m) as illustrated in FIG. 4B. Note that, when the formation is carried out by patterning the first electrode 8, a light-emitting area can be defined by an overlap of the first electrode 8 and the second electrode 11 and a short circuit between the first electrode 8 and the second electrode 11 can be prevented, and thus, it is not necessary to form the insulating layer 9.

Then, the organic EL layer 10 is formed by vacuum deposition on the long ribbon-like laminated body so as to fill the organic EL layer forming portions (α), and then, the second electrode 11 which covers the organic EL layer 10 is formed, and further, the pre-barrier layer 12 is formed under a vacuum under a state in which the terminal regions 3 (both side edges of the organic EL layer 10 along the longitudinal direction) which are portions that can be connected to the wires 4 and 4', respectively, are left, all as a one-step process. Note that, when the second electrode 11 is formed, vacuum deposition is similarly carried out also with regard to the auxiliary electrode forming portion (β) (one side edge of both the side edges of the organic EL layer 10 along the longitudinal direction) which is an opening in the insulating layer 9 to form the auxiliary electrode 15 simultaneously with the second electrode 11.

Figure 5A:
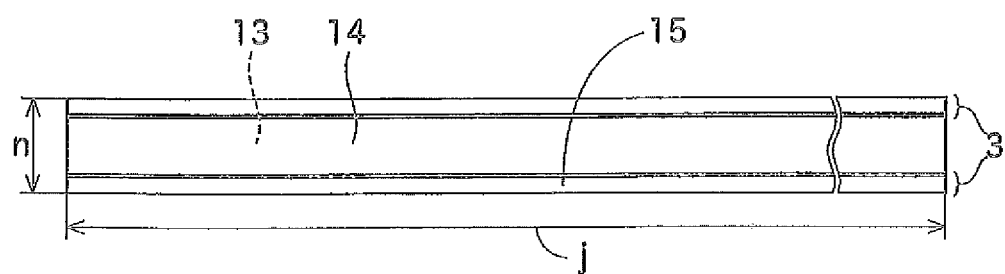
FIGS. 5A and 5B are both explanatory diagrams of a step of obtaining the organic EL element 2.
Figure 5B:
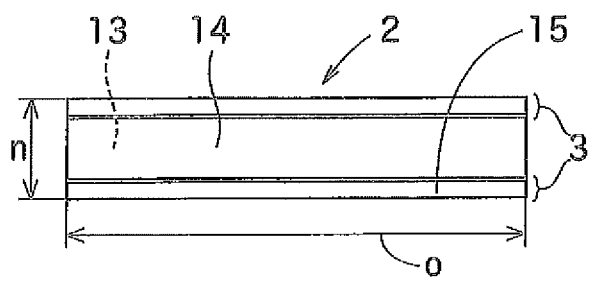

After formation up to the pre-barrier layer 12 is carried out, encapsulation of the long ribbon-like laminated body except for the terminal regions 3 is carried out. The encapsulation is carried out by applying an epoxy-based adhesive to portions of the long ribbon-like laminated body except for the terminal regions 3 and bonding thereto a barrier-type sheet which does not transmit much moisture and oxygen. In this way, as illustrated in FIG. 5A, the encapsulating resin 13 and the barrier-type sheet 14 are laminated on the portions of the long ribbon-like laminated body except for the terminal regions 3 to complete the encapsulation. After the encapsulation is completed, by cutting the laminated body into predetermined lengths (in this embodiment, lengths of 300 mm) under a state in which the organic EL layer 10 is included, the ribbon-like organic EL element 2 having the width n of 20 mm and a length o of 300 mm can be obtained (FIG. 5B).

By arranging a plurality of the ribbon-like organic EL elements 2 obtained in this way on the base material 1 as illustrated in FIG. 1, fixing the plurality of ribbon-like organic EL elements 2 using a pressure-sensitive adhesive material, and connecting the wires 4 and 4' to arbitrary locations of the terminal regions 3 to make electrical connection (mounting) via the electrode terminals 5 and 5' for energization, the organic EL light-emitting device according to the present invention can be obtained.

Figure 6:
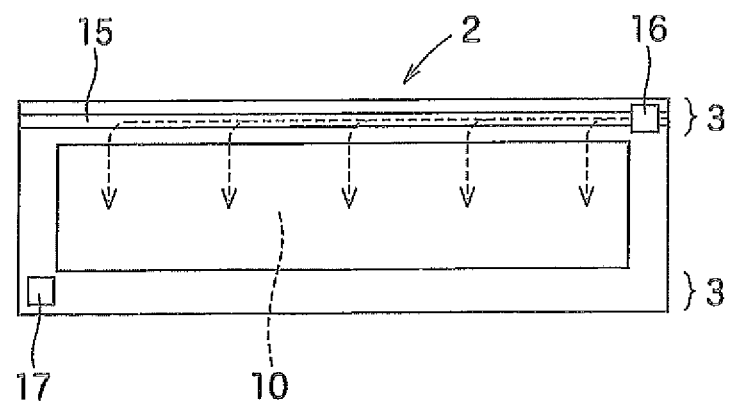
FIG. 6 is an explanatory diagram of the embodiment.

According to this, the organic EL element 2 can be manufactured continuously by a roll-to-roll process at high throughput, and thus, the cost can be reduced. In addition, the steps up to the patterning of the insulating layer 9 are carried out with regard to the long sheet-like substrate 6 having a large width, and the subsequent steps are carried out with regard to the long ribbon-like substrate 6 which is cut to have a predetermined width, and thus, the manufacturing efficiency is high. Further, the steps from the formation of the organic EL layer 10 are carried out with regard to the long ribbon-like substrate 6 which is cut to have a predetermined width, and thus, the vapor deposited films formed under a vacuum can have more uniform thicknesses. Further, no special manufacturing facilities are required to be introduced, and thus, the cost of introducing manufacturing facilities can be inhibited. Further, both the side edges of the organic EL layer 10 in the longitudinal direction are the terminal regions 3, which can be connected to the wires 4 and 4' along the organic EL layer 10, and thus, not specific portions determined in advance as in a conventional case but arbitrary portions in the terminal regions 3 can be terminals depending on the form on which the organic EL element 2 is mounted (the shape and size of the base material 1). Therefore, when the ribbon-like organic EL element 2 is mounted, by arranging two adjacent ribbon-like organic EL elements 2 tightly side by side and connecting their terminal regions 3 using one wire 4 (4'), the number of the wires 4 (4') can be reduced to further reduce the cost. Further, the terminals can be secured with ease even when a plurality of ribbon-like organic EL elements 2 are arranged with an overlap so as to be within the size of the base material 1, and thus, organic EL light-emitting devices of various sizes and shapes which cannot be conventionally manufactured can be manufactured with ease in accordance with the needs of a user. Further, the auxiliary electrode 15 is formed in the terminal region 3 atone side edge of the terminal regions 3 at both the side edges of the organic EL layer 10 along the longitudinal direction, and thus, when the wire 4 is connected onto the auxiliary electrode 15 and this portion is used as an anode terminal 16 as illustrated in FIG. 6, an electric current first flows through the entire auxiliary electrode 15 via the anode terminal 16, and then, as shown by dotted arrows, flows through the entire organic EL layer 10. Therefore, voltage is applied more uniformly to the entire organic EL layer 10, and uneven brightness is less liable to be caused.

In this way, the organic EL light-emitting device according to the present invention uses the ribbon-like organic EL element 2 in which uneven brightness is less liable to be caused, and thus, even when the number of the organic EL elements 2 is increased to increase the size of the organic EL light-emitting device, uneven brightness is not caused. Further, electrical connection is not made on the organic EL layer 10, and thus, the organic EL layer 10 is not damaged. Therefore, also in this respect, uneven brightness is less liable to be caused in the organic EL element 2, and, by extension, even when the number of the organic EL elements 2 is increased to increase the size of the organic EL light-emitting device, uneven brightness is not caused. Further, as described above, the organic EL element 2 which is manufactured at low cost is used, and thus, the organic EL light-emitting device as a whole can be manufactured at low cost.

Figure 7:
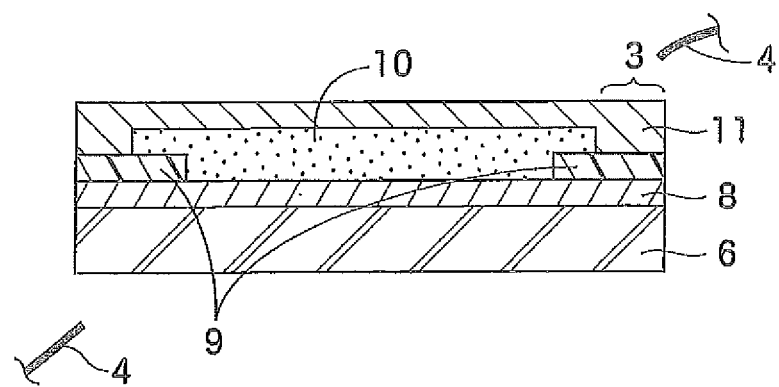
FIG. 7 is a sectional view of a modified example of the embodiment.
Figure 8A:
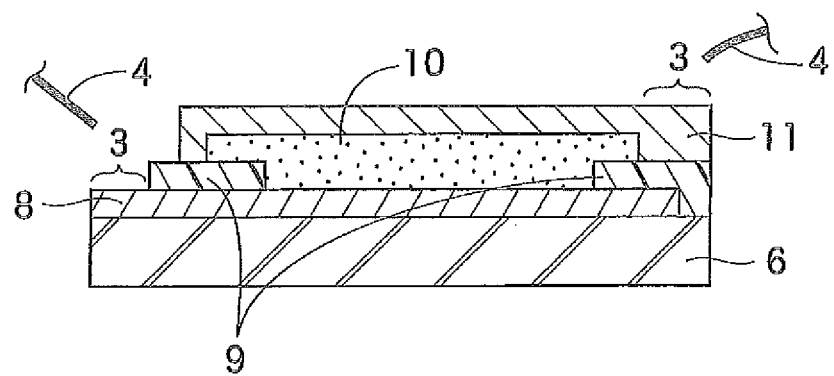
FIGS. 8A and 8B are both sectional views of modified examples of the embodiment.
Figure 8B:
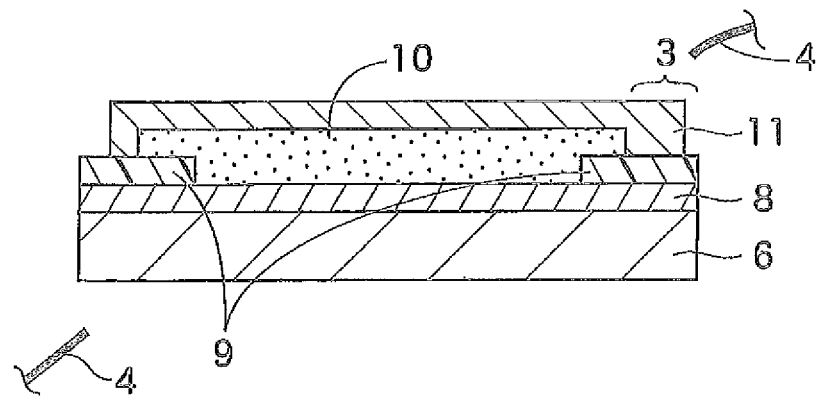
Figure 9A:
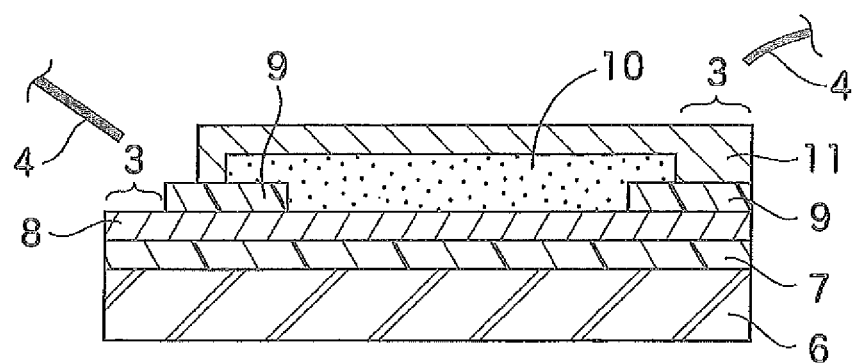
FIGS. 9A and 9B are both sectional view of modified examples of the embodiment.
Figure 9B:
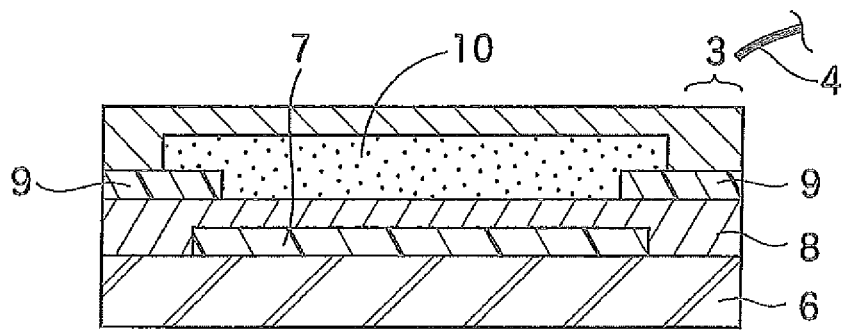
Figure 10A:
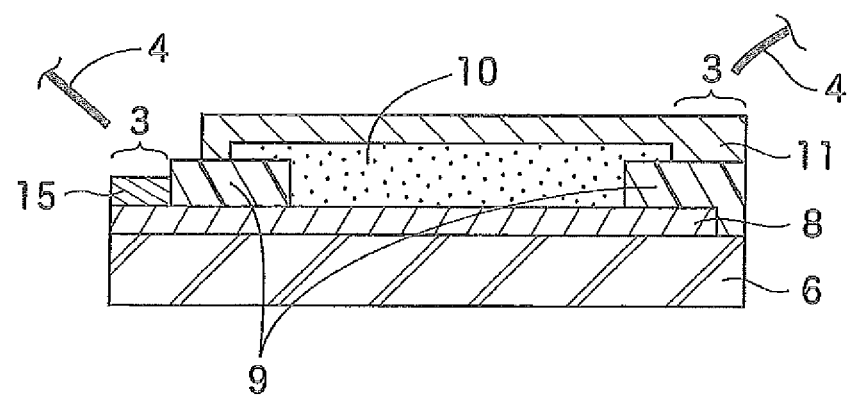
FIGS. 10A and 10B are both sectional views of modified examples of the embodiment.
Figure 10B:
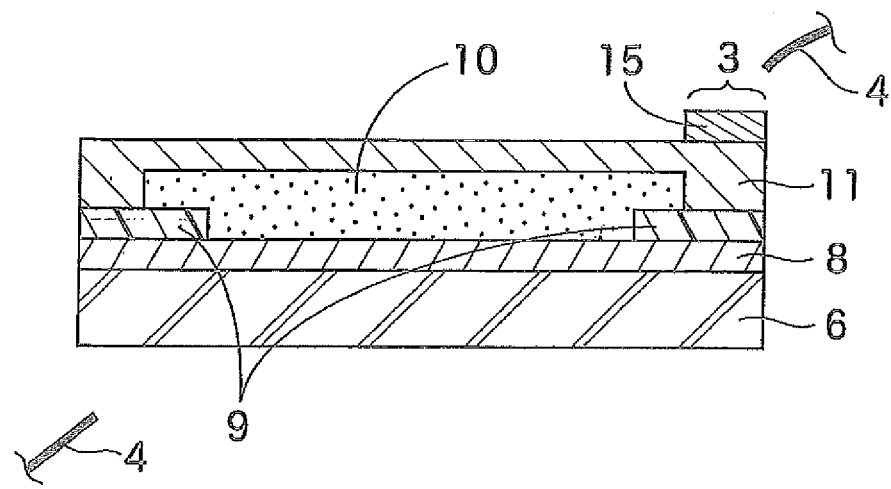
Figure 11:
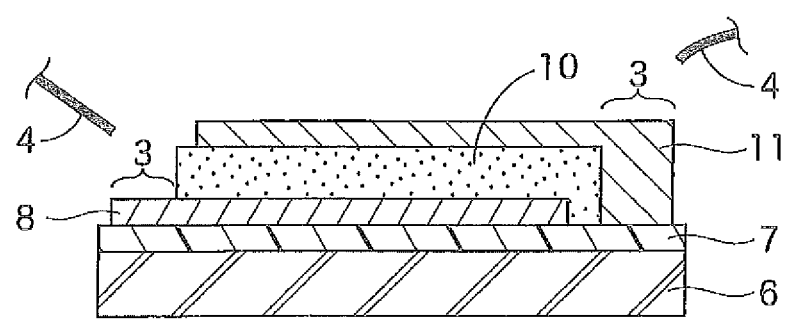
FIG. 11 is a sectional view of a modified example of the embodiment.

In the embodiment described above, the organic EL element 2 is a bottom emission type having the structure illustrated in FIG. 3, but may have various other structures. For example, a top emission type as illustrated in FIG. 7 is also possible. In this case, one power source is drawn from a rear surface side of the substrate 6 (lower left of the figure), and thus, the terminal region 3 is provided only at one side edge (upper right of the figure) of both the side edges of the organic EL layer 10 of the organic EL element 2 along the longitudinal direction. Further, the structure may have various variations. For example, structures illustrated in FIGS. 8A and 8B, FIGS. 9A and 9B, FIGS. 10A and 10B, and FIG. 11 are also possible. Note that, in the above-mentioned figures, various kinds of encapsulating layers are omitted.

In the embodiment described above, the substrate 6 of the organic EL element 2 is flexible thin glass. Other than this, a material which is highly transparent for the purpose of transmitting emitted light and which has barrier-properties for the purpose of protecting the organic EL layer 10 against oxygen and moisture can be used. Exemplary materials include a film made of a synthetic resin such as a thermosetting resin or a thermoplastic resin such as barrier-type polyimide-based resin, polyester-based resin, epoxy-based resin, polyurethane-based resin, polystyrene-based resin, polyethylene-based resin, polyamide-based resin, acrylonitrile butadiene styrene (ABS) copolymer resin, polycarbonate-based resin, silicone-based resin, and fluorine-based resin. Further, the thickness is appropriately selected usually in a range of 5 to 500 μm, preferably in a range of 10 to 300 μm from the viewpoint of a balance between mechanical strength and flexibility. Further, in order to obtain barrier properties, a method involving alternately laminating a thin organic layer and a thin inorganic layer or the like may be used.

Further, when the organic EL element 2 is a top emission type, it is not necessary for the substrate 6 to be transparent, and thus, as the substrate 6, in addition to the above-mentioned embodiment, metals such as stainless steel, alloys such as 36 alloy and 42 alloy, copper, nickel, iron, aluminum, and titanium may be used. Of those materials, from the viewpoint of high thermal conductivity for dissipating heat of the organic EL layer 10 with efficiency and of applicability to a roll-to-roll process, it is preferred to use copper, aluminum, stainless steel, and titanium. When the organic EL element 2 is a top emission type, it is preferred that the substrate 6 have a thickness of 5 to 200 μm. When the thickness is too small, ease of handling tends to be deteriorated. On the other hand, when the thickness is too large, winding the substrate 6 in a roll tends to be difficult, which is not suitable for a roll-to-roll process.

In the embodiment described above, the planarizing layer 7 of the organic EL element 2 is formed of an organic EL insulating material (JEM-477 manufactured by JSR Corporation), but, other than this embodiment, an inorganic layer may be provided by plating or vacuum deposition to be used as the planarizing layer 7, or, a resin or an inorganic film may be wet coated to be used as the planarizing layer 7. Further, when the surface of the substrate 6 itself is planarized, or when the surface of the substrate 6 is ground to planarize the surface of the substrate 6, it is not necessary to provide the planarizing layer 7. Note that, it is preferred that the surface of the substrate 6 or the surface of the planarizing layer 7 have a surface roughness Ra of 20 nm or less and a surface roughness Rmax of 50 nm or less. Specifically, when the unevenness on the surface of the substrate 6 or the surface of the planarizing layer 7 is too large, the thickness of the organic EL layer 10 formed thereon is small, and thus, a short circuit between the first electrode 8 and the second electrode 11 tends to be caused.

When the first electrode 8 of the organic EL element 2 is used as an anode, from the viewpoint of hole injectability, it is preferred that a material having a large work function be used. Such materials include, for example, various kinds of transparent conductive materials such as indium tin oxide (ITO) and indium zinc oxide (IZO), metals such as gold, silver, platinum, and aluminum, and alloy materials of such metals. When, in particular, the organic EL element 2 is a bottom emission type as in the above-mentioned embodiment, or a see-through type, a material which is highly transparent and highly conductive is preferred. On the other hand, when the first electrode 8 is used as a cathode, it is preferred to use a material having a small work coefficient with which electron injection can be easily carried out. Such materials include, for example, metals such as aluminum and magnesium, and alloys thereof. Note that, when the substrate 6 is conductive, the substrate 6 itself can be used as the first electrode, and thus, it is not necessary to additionally form the first electrode 8. When carrier injection cannot be easily carried out under the influence of an oxide film on the surface of the substrate 6 or the like, sputtering or the like may be used to form a metal film, an alloy film, a transparent conductive film, or the like having an appropriate work coefficient at a thickness of 5 to 200 nm on the surface of the substrate 6.

The insulating layer 9 of the organic EL element 2 is provided for the purpose of preventing a short circuit between the first electrode 8 and the second electrode 11. When the light-emitting area is defined by the insulating layer 9, the allowable range of misalignment in a width direction becomes wider, which can further facilitate continuous manufacture by a roll-to-roll process. It is preferred that the material of such an insulating layer 9 be insulating, and not contain much moisture and not release much gas because moisture and out gassing adversely affect the characteristics and the life of the organic EL element. Further, when the organic EL element 2 is a see-through type, it is preferred to use a highly transparent material.

The organic EL layer 10 of the organic EL element 2 is a layer which at least includes a light-emitting layer, and a hole injection layer, a hole transport layer, an electron blocking layer, a hole blocking layer, an electron transport layer, an electron injection layer, and the like are appropriately used in combination or solely depending on the application. The thickness of the organic EL layer 10 is several nanometers to several hundred nanometers, and, from the viewpoint of light emission efficiency, life, and the like, a thickness in accordance with the purpose is selected.

It is preferred that the second electrode 11 of the organic EL element 2 be formed of a highly conductive material due to the need for efficiently passing a current therethrough. When the second electrode 11 is used as a cathode, it is preferred that a material having a small work coefficient with which electron injection can be easily carried out be used. Such materials include, for example, metals such as aluminum and magnesium, and alloys thereof. Further, for the purpose of improving the electron injectability, a material containing an alkaline-earth metal may be included. On the other hand, when the second electrode 11 is used as an anode, from the viewpoint of hole injectability, it is preferred that a material having a large work function be used. Such materials include, for example, metals such as gold, silver, and platinum, and alloy materials of such metals. When, in particular, the organic EL element 2 is a top emission type as in the above-mentioned embodiment, or a see-through type, it is preferred to use a material which is highly transparent and highly conductive.

The pre-barrier layer 12 of the organic EL element 2 prevents damage caused by moisture, oxygen, and the like until the encapsulation is carried out in a post step, and prevents damage in the encapsulation step. It is preferred that the material of the pre-barrier layer 12 not contain much moisture and not release much gas. When, in particular, the organic EL element 2 is a top emission type or a see-through type, it is preferred to use a highly transparent material. Such materials include, for example, inorganic oxides such as silicon oxide. Note that, when the second electrode 11 itself has the above-mentioned pre-barrier function, it is not necessary to additionally provide the pre-barrier layer 12.

Encapsulation of the organic EL element 2 used in the present invention is carried out for the purpose of completely preventing entrance of moisture and oxygen. In the embodiment described above, the encapsulation is carried out by applying an epoxy-based adhesive to portions of the long ribbon-like laminated body on the pre-barrier layer 12 except for the terminal regions 3 (encapsulating resin 13) and bonding thereto a barrier-type sheet which does not transmit much moisture and oxygen (barrier-type sheet 14). Other than this embodiment, an adhesive material which does not contain much moisture and does not release much gas may be used as the encapsulating resin 13. When, in particular, the organic EL element 2 is a top emission type or a see-through type, it is preferred to use a highly transparent material. Further, a material which has the property of removing moisture and oxygen may be contained in the encapsulating resin 13. As the barrier-type sheet 14, a flexible and barrier-type film-like sheet which does not transmit much moisture and oxygen maybe used, and, when the organic EL element 2 is a bottom emission type, a metal or the like may also be used.

The auxiliary electrode 15 of the organic EL element 2 is formed simultaneously with the second electrode 11 in a similar way. However, the second electrode 11 and the auxiliary electrode 15 are not necessarily required to be formed simultaneously, and may be formed in different ways using different materials. For example, it is possible not to form the auxiliary electrode 15 when the second electrode 11 is formed, and, when the organic EL element 2 is mounted on the base material 1, a conductive tape may be bonded onto the terminal region 3 so as to be used as the auxiliary electrode 15. Note that, the auxiliary electrode 15 is not necessarily required to be provided, but, provision of the auxiliary electrode 15 enables more uniform application of voltage to the entire organic EL layer 10, which is preferred. Further, in the embodiment described above, the auxiliary electrode 15 is provided only at one side edge of the terminal regions 3 at both the side edges of the organic EL layer along the longitudinal direction, but may be provided at both the side edges. When the auxiliary electrode 15 is provided at both the side edges, voltage can be applied more uniformly to the entire organic EL layer 10, and thus, uneven brightness is less liable to be caused.

In the embodiment described above, the steps up to the formation of the insulating layer 9 are carried out with regard to the long sheet-like substrate 6 having a large width, and the steps from the formation of the organic EL layer 10 are carried out with regard to the long ribbon-like substrate 6, but the steps from the beginning (including the steps up to the formation of the insulating layer 9) may be carried out with regard to the long ribbon-like substrate 6. However, from the viewpoint of enhancing the manufacturing efficiency, it is preferred to carry out the steps up to the patterning of the insulating layer (formation of the insulating layer 9) with regard to the long sheet-like substrate 6 having a large width and to carry out the steps from the formation of the organic EL layer 10 with regard to the long ribbon-like substrate 6.

In the embodiment described above, the base material 1 is formed of substantially plate-like glass. Other than this embodiment, a material which is highly transparent to adapt to a light extraction surface can be used. Further, when the organic EL element 2 is a top emission type, transparency of the base material 1 is not necessary. Therefore, other than glass, a component such as a metal plate, a film, a construction such as window glass, a wall, or a ceiling can be used as the base material 1. Further, with regard to the shape of the base material 1, not only a substantially plate-like shape but also various kinds of shapes such as a sphere and a circular cylinder may be used.

The organic EL light-emitting device is obtained by arranging a plurality of the above-mentioned ribbon-like organic EL elements 2 on the base material 1 having the wires 4 and 4' arranged thereon, fixing the plurality of the ribbon-like organic EL elements 2, making connection to the electrode terminals 5 and 5' for energization, and carrying out encapsulation (resin encapsulation, adhesion of a transparent flexible base, or the like). Note that, when the base material 1 and the encapsulation (a resin, a transparent flexible base, or the like) used have high barrier properties, it is not necessary to carry out the encapsulation in the organic EL element 2 (the encapsulating resin 13 and the barrier-type sheet 14). On the other hand, when encapsulation is carried out to a large extent with regard to the organic EL element 2, the base material 1 and the encapsulation (the resin and the transparent flexible base) are not required to have high barrier properties, and an inexpensive resin film or the like can be used.

The organic EL light-emitting device includes the plurality of ribbon-like organic EL elements 2. The organic EL elements 2 may emit different colors of light. By appropriately arranging the organic EL elements 2 of different colors, excellence in design which is required of a light-emitting component for display decoration, digital signage, and the like may be obtained. Further, even when the organic EL light-emitting device emits white color, the white color maybe represented by combining the organic EL elements 2 which emit the three primary colors of light, that is, red, blue, and green.

In the organic EL light-emitting device, the arrangement of the wires 4 and 4' on the base material 1 may be carried out using a method and a material which are similar to those of a general flexible circuit board or a general rigid circuit board. Further, the organic EL element 2 can be fixed to the base material 1 using a pressure-sensitive adhesive material or an adhesive. From the viewpoint dissipating heat of the organic EL layer 10 with efficiency, it is preferred to use a highly thermally conductive material. Further, electrical bonding between the organic EL element 2 and the wires 4 and 4' may be made using a manufacturing process of a semiconductor package, or the like, and, for example, it is preferred to use wire bonding or solder reflow. Further, the electrical bonding may be made using a conductive paste or conductive tape. Note that, it is preferred that the electrical bonding between the organic EL element 2 and the wires 4 and 4' be made in a process at a lower temperature from the viewpoint of avoiding adverse effects on the organic EL element 2.

Next, an example is described together with comparative examples. However, the present invention is not limited thereto.

EXAMPLE

In this example, first, top emission type ribbon-like organic EL elements were continuously manufactured by a roll-to-roll process. After that, the manufactured plurality of ribbon-like organic EL elements were mounted on the base material to manufacture the organic EL light-emitting device. As the comparative examples, a top emission type square organic EL element (Comparative Example 1) and top emission type fiber-like organic EL elements (Comparative Example 2) were manufactured by a roll-to-roll process similarly to the case of the example and were mounted on the base materials which were the same as that used in the example to manufacture organic EL light-emitting devices, respectively.

Example 1

Figure 12A:
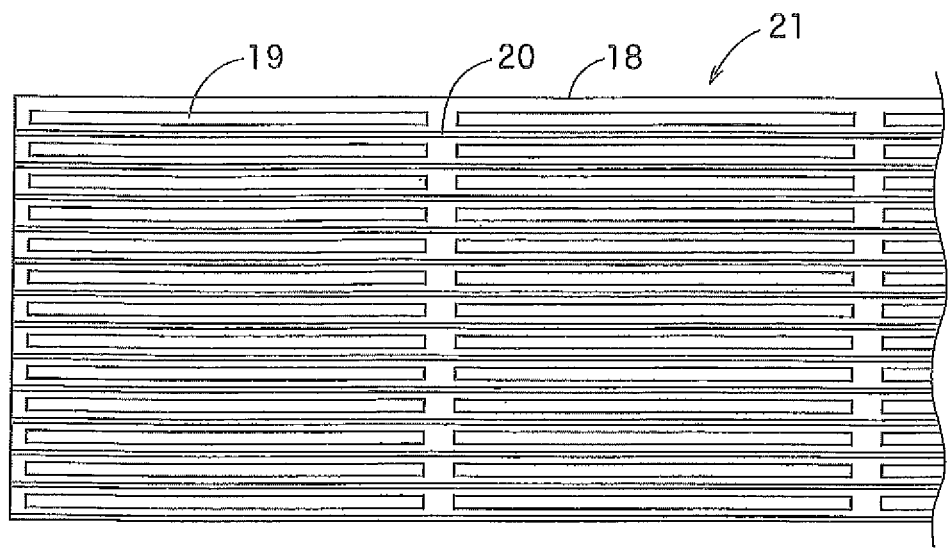
FIGS. 12A to 12C are explanatory diagrams of steps of obtaining a product of Example 1.
Figure 12B:
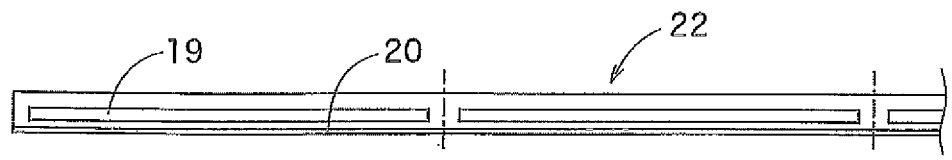
Figure 12C:
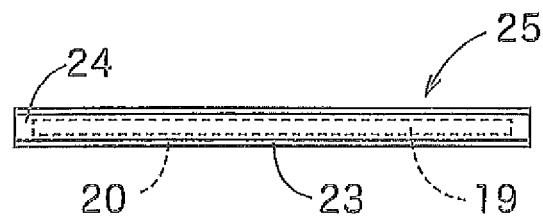

Prior to the manufacture of the organic EL elements, as illustrated in FIG. 12A, as a long sheet-like substrate 18, a SUS 304 foil having a width of 300 mm, a length of 140 m, and a thickness of 25 μm was prepared.
<Formation of Planarizing Layer>
By applying an organic EL insulating material manufactured by JSR Corporation (JEM-477) onto the prepared long sheet-like substrate 18 and drying, and carrying out postbaking at 220° C. for 1 hour, a planarizing layer having a thickness of 1.5 μm was formed.
<Formation of First Electrode>
Then, using a long sputtering apparatus, IZO (20 nm)/silver-based alloy containing palladium and copper (APC manufactured by Furuya Metal Co., Ltd.) (100 nm)/IZO (100 nm) were formed on the planarizing layer as a reflective layer and an anode.
<Formation of Insulating Layer>
As the insulating layer, the organic EL insulating material manufactured by JSR Corporation (JEM-477) was applied onto the formed first electrode and dried. After exposure using a proximity exposure apparatus via a predetermined photomask, development was carried out using 2.38 wt % of tetramethylammonium hydroxide (TMAH) . After water cleaning, moisture was removed and then postbaking was carried out at 220° C. for 1 hour. The thickness of the insulating layer after the postbaking was about 1.5 μm. Note that, the pattern of the insulating layer included openings 19 each having a width of 11 mm and a length of 280 mm and openings 20 each having a width of 2.5 mm across the entire length of the insulating layer (see FIG. 12A). After that, the long sheet-like laminated body 21 was cut by a laser along its longitudinal direction into pieces each having a line of the openings 19 and the opening 20 so that each piece had a predetermined width to obtain a long ribbon-like laminated body 22 having a width of 20 mm and a length of 140 m (see FIG. 12B).
<Formation of Organic EL Layer, Second Electrode, and Pre-Barrier Layer>
The long ribbon-like laminated body 22 was set in a vacuum deposition apparatus after UV/O₃ treatment (surface modifying treatment using synergistic action of ultraviolet light and ozone), and, under a vacuum, copper phthalocyanine (CuPc) of 25 nm, N,N'-diphenyl-N-N-bis(1-naphthyl)-1,1'-biphenyl)-4,4'-diamine (NPB) of 45 nm, 8-quinolinol aluminum complex (Alq3) of 60 nm, lithium fluoride (LiF) of 0.5 nm, aluminum (Al) of 1 nm, aluminum (Al) of 100 nm (only with regard to the auxiliary electrode portion), silver (Ag) of 15 nm, and silicon oxynitride (SiON) of 100 nm were formed in this order. Note that, Al (100 nm) in the auxiliary electrode portion was formed by vapor deposition via a shadow mask which had an opening having a width of 2.5 mm formed therein and which was formed of SUS so as to have a width of 2.5 mm over the opening 20 as the auxiliary electrode forming portion, to thereby form the auxiliary electrode.
<Encapsulation and Cutting of Organic EL Element>
The long ribbon-like laminated body 22 on which formation of up to the pre-barrier layer was completed was once wound around a takeup roll. After nitrogen gas was introduced to obtain atmospheric pressure, the long ribbon-like laminated body 22 was moved into another chamber under a nitrogen atmosphere, and thin glass 24 having a thickness of 100 μm manufactured by Nippon Electric Glass Co., Ltd. was bonded using an epoxy-based adhesive to portions except for the terminal regions (both the side edges of the organic EL layer along the longitudinal direction). After the adhesive was cured, the long ribbon-like laminated body 22 was taken out to the air, and, as illustrated by dot-and-dash lines in FIG. 12B, was cut into pieces each having a length of 300 mm to obtain the ribbon-like organic EL element 25 of 20 mm×300 mm (see FIG. 12C).
<Mounting>
Fifteen ribbon-like organic EL elements 25 described above were mounted on a base material of 300 mm×300 mm in a state of unified orientation of the length direction to obtain an organic EL light-emitting device having a size of 300 mm×300 mm.

Comparative Example 1

Figure 13A:
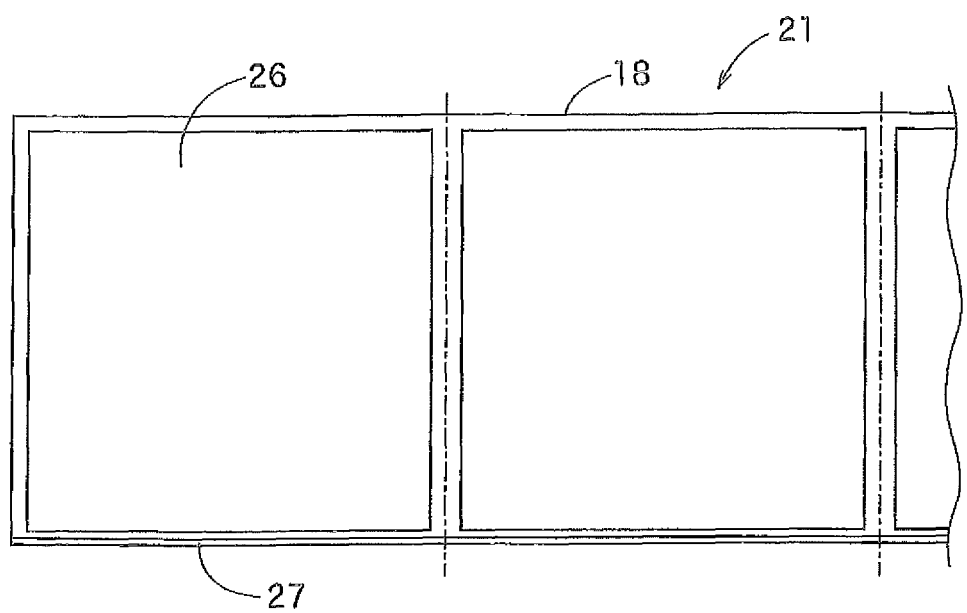
FIGS. 13A and 13B are both explanatory diagrams of steps of obtaining a product of Comparative Example 1.
Figure 13B:
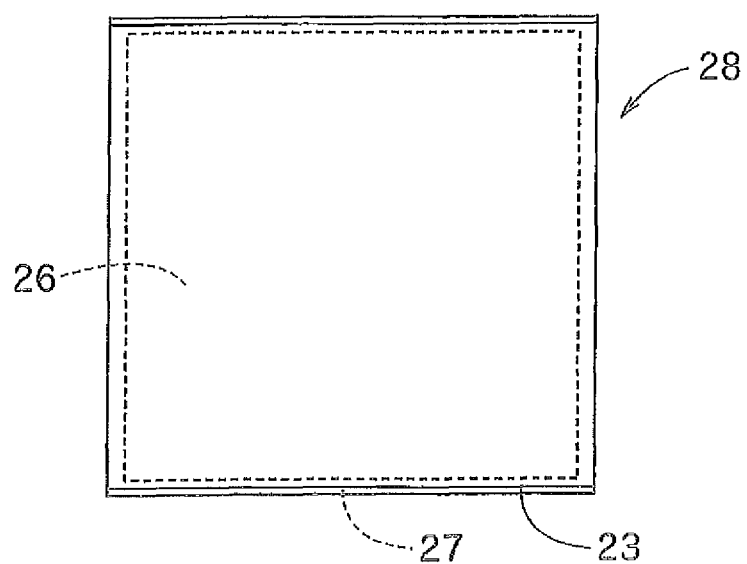

One large organic EL element 28 of 300 mm×300 mm (see FIG. 13B) was manufactured similarly to the case of Example 1 except that the pattern of the insulating layer had openings 26 each having a width of 280 mm and a length of 280 mm and an opening 27 having a width of 5 mm across the entire length of the insulating layer (see FIG. 13A) and except that cutting along the longitudinal direction was not carried out. One manufactured organic EL element 28 was mounted on a base material which was similar to that in Example 1 in a state of unified orientation of the length direction to obtain an organic EL light-emitting device having a size of 300 mm×300 mm.

Comparative Example 2

Figure 14A:
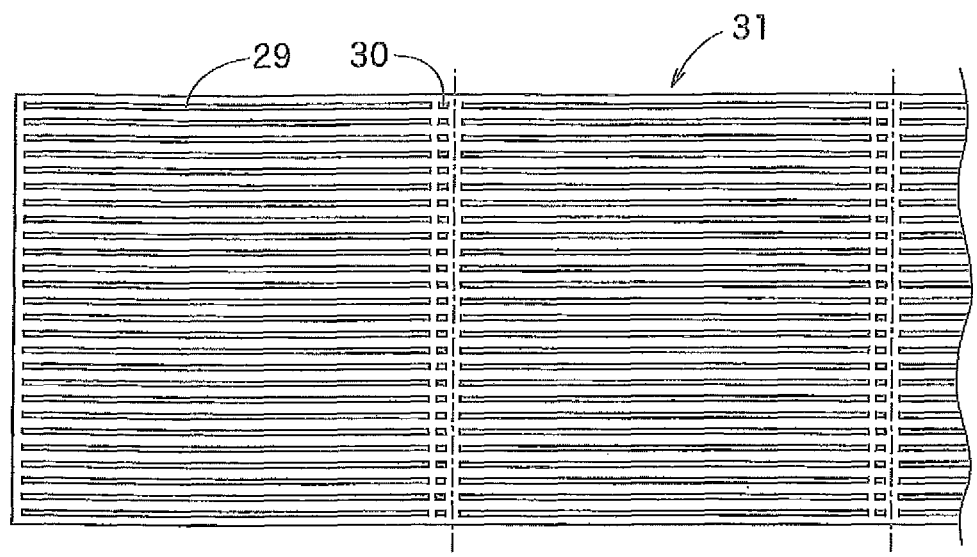
FIGS. 14A and 14B are both explanatory diagrams of steps of obtaining a product of Comparative Example 2.
Figure 14B:
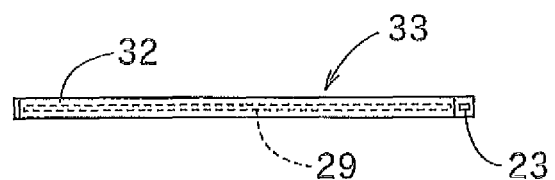

A long sheet-like laminated body 31 was formed under a state in which the pattern of the insulating layer had openings 29 each having a width of 0.5 mm and a length of 280 mm and openings 30 each having a width of 0.5 mm and a length of 5 mm, shadow masks having openings at locations necessary for forming an organic layer, a cathode layer, and a pre-barrier layer, respectively, were aligned along the longitudinal direction, and a base was intermittently fed (see FIGS. 14A and 14B). Thin glass 32 (having a width of 1 mm and a length of 300 mm) was bonded to the long sheet-like laminated body 31 to carry out encapsulation so as to cover the openings 29 in a state of being aligned along the longitudinal direction. Then, cutting was carried out along the longitudinal direction so that each of the cut pieces had a width of 1 mm, and, as illustrated by dot-and-dash lines in FIG. 14A, cutting was carried out so that each of the cut pieces included an opening 29 and had a length of 300 mm to manufacture 300 fiber-like organic EL elements 33 each having a size of 1 mm×300 mm. The 300 manufactured organic EL elements 33 were mounted on a base material which was similar to that in Example 1 to obtain an organic EL light-emitting device having a size of 300 mm×300 mm.

Evaluation on the following points was made with regard to the obtained organic EL light-emitting devices according to the example and comparative examples. The results are shown in Table 1.

<Investment in Manufacturing Facilities>

Evaluation was made with regard to the cost of introducing manufacturing facilities for the organic EL elements.

∘: Small vacuum equipment can be used, and thus, the introduction cost is low.

×: Large vacuum equipment needs to be built, and thus, the introduction cost is high.

<Manufacture Continuity>

Evaluation was made on whether the roll-to-roll process could be carried out easily as a continuous process in the manufacturing process of the organic EL elements.

∘: The roll-to-roll process can be easily carried out as a continuous process.

×: The roll-to-roll process is difficult to carry out as a continuous process.

<Film Thickness Uniformity>

Evaluation was made with regard to nonuniformity in film thickness when the first electrode was formed on the substrate having the planarizing layer formed thereon in the manufacturing process of the organic EL elements. The evaluation was made by measuring the thickness of the first electrode at five locations, that is, the four corners and the center of the substrate using a DEKTAK 3ST profilometer manufactured by Sloan Technology, and comparing the values.

∘: The film thickness was almost the same at the five locations of measurement.

×: The film thickness varied among the five locations of measurement.

<Yields>

All the organic EL elements of the organic EL light-emitting devices before being mounted thereon were visually observed. An organic EL element having a defective light-emitting region was defined as a failure, and an organic EL element without a defective light-emitting region was defined as a no-failure. "The area of no-failure organic EL elements/the area of all the organic EL elements (no-failures+failures)×100" was calculated and the calculated value was evaluated as the yields.

<Mounting Cost>

The mounting cost was calculated taking into consideration an apparatus necessary for mounting the organic EL elements on a base material and time necessary for the mounting.

∘: The structure of the apparatus is simple and the time taken for the mounting is short.

×: The structure of the apparatus is complicated and the time taken for the mounting is long.

<Uneven Brightness>

The screen was visually observed from various directions in a darkroom, and evaluation was made on whether there was uneven brightness or not (sensory evaluation of uneven display including moire).

∘: Uneven brightness was not observed.

×: Uneven brightness was clearly observed.

TABLE 1

| Evaluation Point | | Example 1 | Comparative Example 1 | Comparative Example 2 |
|---|---|---|---|---|
| Organic EL Element | Investment in Manufacturing Facilities | ∘ | × | ∘ |
| | Manufacture Continuity | ∘ | ∘ | × |
| | Film Thickness Uniformity | ∘ | × | ∘ |
| | Yields | 97.0% | 55.0% | 99.9% |
| Organic EL Light-emitting Device | Number of Mounted Elements | 15 | 1 | 300 |
| | Mounting Cost | ∘ | ∘ | × |
| | Uneven Brightness | ∘ | × | × |

In this way, the organic EL light-emitting device of Example 1 was excellent in performance and organic EL elements manufactured at low cost were mounted thereon at low cost, and thus, the device as a whole could be manufactured at low cost, and in addition, no uneven brightness was caused. On the other hand, in the organic EL light-emitting device of Comparative Example 1, the performance of the organic EL element was poor, and thus, the performance of the organic EL light-emitting device having the organic EL element mounted thereon was also poor. Further, in the organic EL light-emitting device of Comparative Example 2, not only the performance itself of the organic EL elements was poor but also the manufacture thereof could not be carried out by a continuous process, and thus, it took a long time to manufacture the organic EL elements, and the cost increased in proportion thereto. Further, it took a long time to mount the organic EL elements, which further increased the cost.

Although specific forms of embodiments of the instant invention have been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention.

The organic EL light-emitting device according to the present invention can be used for an illuminating apparatus, a backlight unit of a liquid crystal display, a light-emitting component for display decoration, digital signage, and the like.

What is claimed is:

1. An organic electroluminescent light-emitting device, comprising:
    a plurality of organic electroluminescent elements arranged over a base material, each of the plurality of organic electroluminescent elements comprising a ribbon-shaped substrate, an organic electroluminescent layer, and a first electrode and a second electrode which vertically sandwich the organic electroluminescent layer,
    wherein an entirety of the each of the plurality of organic electroluminescent elements has a ribbon shape;
    wherein the organic electroluminescent layer sandwiched between the first electrode and the second electrode is formed along a longitudinal direction of the ribbon-shaped substrate;
    wherein a terminal region for connecting the first electrode to a power source is provided and exposed at one side edge of the organic electroluminescent layer along the longitudinal direction of the organic electroluminescent layer, and wherein a terminal region for connecting the second electrode to the power source is provided and exposed at the other side edge of the organic electroluminescent layer along the longitudinal direction of the organic electroluminescent layer.

2. The organic electroluminescent light-emitting device according to claim 1, wherein the terminal region is connectable to the power source via an auxiliary electrode.

3. A method of manufacturing an organic electroluminescent light-emitting device, comprising:

arranging a plurality of organic electroluminescent elements each formed by the following steps (A) to (F) over a base material; and making electrical connection at arbitrary locations of terminal regions of the plurality of organic electroluminescent elements:

(A) forming a first electrode over a sheet substrate;

(B) cutting along a longitudinal direction of the sheet substrate having the first electrode formed thereover to form a ribbon-shaped laminated body;

(C) forming, over the ribbon-shaped laminated body, an organic electroluminescent layer along the longitudinal direction thereof;

(D) forming a second electrode over the organic electroluminescent layer;

(E) under a state in which, among both side edges of the ribbon-shaped laminated body along the longitudinal direction, one side edge is left not encapsulated, encapsulating an upper surface of the ribbon-shaped laminated body by using an encapsulating material; and (F) cutting the ribbon-shaped laminated body to form a ribbon-shaped laminated body having a predetermined length, wherein the organic electroluminescent elements include a terminal region for connecting the first electrode to a power source, provided and exposed at the one side edge of the organic electroluminescent layer along the longitudinal direction of the organic electroluminescent layer, and a terminal region for connecting the second electrode to the power source, provided and exposed at the other side edge of the organic electroluminescent layer along the longitudinal direction of the organic electroluminescent layer.

4. A method of manufacturing an organic electroluminescent light-emitting device, comprising:

arranging a plurality of organic electroluminescent elements each formed by the following steps (A) to (F) over a base material; and making electrical connection at arbitrary locations of terminal regions of the plurality of organic electroluminescent elements:

(A) forming a first electrode over a sheet substrate;

(B-1) forming, using a photomask, over the first electrode, an insulating layer in which openings for exposing predetermined portions are arranged in a width direction in a plurality of lines;

(B-2) cutting the sheet substrate having the insulating layer formed thereon along the longitudinal direction into pieces, each having a line of the openings arranged therein to form a ribbon-shaped laminated body; and (C-1) forming, over the ribbon-shaped laminated body, an organic electroluminescent layer at least filling the openings;

(D) forming a second electrode over the organic electroluminescent layer;

(E) under a state in which, among both side edges of the ribbon-shaped laminated body along the longitudinal direction, one side edge is left not encapsulated, encapsulating an upper surface of the ribbon-shaped laminated body by using an encapsulating material; and (F) cutting the ribbon-shaped laminated body to form a ribbon-shaped laminated body having a predetermined length, wherein the organic electroluminescent elements include a terminal region for connecting the first electrode to a power source, provided and exposed at the one side edge of the organic electroluminescent layer along the longitudinal direction of the organic electroluminescent layer, and a terminal region for connecting the second electrode to the power source, provided and exposed at the other side edge of the organic electroluminescent layer along the longitudinal direction of the organic electroluminescent layer.

5. The method of manufacturing an organic electroluminescent light-emitting device according to claim 3, further comprising the following step (G):

(G) forming an auxiliary electrode at the side edge on which the electrode for connection to the power source is located.

6. The method of manufacturing an organic electroluminescent light-emitting device according to claim 4, further comprising the following step (G):

(G) forming an auxiliary electrode at the side edge on which the electrode for connection to the power source is located.

7. The method of manufacturing an organic electroluminescent light-emitting device according to claim 3, wherein at least the steps (C) to (E) are carried out under a vacuum or under an inactive gas atmosphere; and wherein the steps (C) to (E) are respectively carried out without being exposed to air and the nonexposure to the air is kept also between the steps.

8. The method of manufacturing an organic electroluminescent light-emitting device according to claim 4, wherein at least the steps (C-1), (D) and (E) are carried out under a vacuum or under an inactive gas atmosphere; and wherein the steps (C-1), (D) and (E) are respectively carried out without being exposed to air and the nonexposure to the air is kept also between the steps.

9. The organic electroluminescent light-emitting device according to claim 1, wherein the second electrode covers both side edges of the organic electroluminescent material.

10. The organic electroluminescent light-emitting device according to claim 1, wherein the terminal region for connecting the second electrode is a portion of the second electrode.

11. The organic electroluminescent light-emitting device according to claim 9, wherein the terminal region for connecting the second electrode is a portion of the second electrode.

12. The method of manufacturing an organic electroluminescent light-emitting device according to claim 3, in step (D), the second electrode is formed so as to cover both side edges of the organic electroluminescent material.

13. The method of manufacturing an organic electroluminescent light-emitting device according to claim 3, wherein the terminal region for connecting the second electrode is a portion of the second electrode.

14. The method of manufacturing an organic electroluminescent light-emitting device according to claim 12, wherein the terminal region for connecting the second electrode is a portion of the second electrode.

15. The method of manufacturing an organic electroluminescent light-emitting device according to claim 4, in step (D), the second electrode is formed so as to cover both side edges of the organic electroluminescent material.

16. The method of manufacturing an organic electroluminescent light-emitting device according to claim 4, wherein the terminal region for connecting the second electrode is a portion of the second electrode.

17. The method of manufacturing an organic electroluminescent light-emitting device according to claim 15, wherein the terminal region for connecting the second electrode is a portion of the second electrode.

18. An organic electroluminescent light-emitting device, comprising:

a plurality of organic electroluminescent elements arranged over a base material, each of the plurality of organic electroluminescent elements comprising a ribbon-shaped substrate, an organic electroluminescent layer, and a first electrode and a second electrode which vertically sandwich the organic electroluminescent layer, wherein an entirety of the each of the plurality of organic electroluminescent elements has a ribbon shape;

wherein the organic electroluminescent layer sandwiched between the first electrode and the second electrode is formed along a longitudinal direction of the ribbon-shaped substrate;

wherein a terminal region for connecting the second electrode to a power source is provided and exposed at one side edge of the organic electroluminescent layer along the longitudinal direction of the organic electroluminescent layer; and wherein the first electrode can be connected to the power source on a surface side of the ribbon-shaped substrate which is opposite to a surface side of the ribbon-shaped substrate which is in contact with the first electrode.

19. The organic electroluminescent light-emitting device according to claim 18, wherein the surface side of the ribbon-shaped substrate which is opposite to the surface side of the ribbon-shaped substrate which is in contact with the first electrode is exposed.

* * * * *